(12) United States Patent
Ballantyne

(10) Patent No.: US 6,674,335 B1
(45) Date of Patent: Jan. 6, 2004

(54) BLIND LINEARIZATION USING CROSS-MODULATION

(75) Inventor: Gary John Ballantyne, Christchurch (NZ)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 10/187,040

(22) Filed: Jun. 28, 2002

(51) Int. Cl.⁷ .................................................. H03C 1/06
(52) U.S. Cl. ........................................ 332/160; 332/149
(58) Field of Search ................................. 332/160, 159, 332/149, 176, 177

(56) References Cited

U.S. PATENT DOCUMENTS

| | | | | | |
|---|---|---|---|---|---|
| 5,049,832 A | * | 9/1991 | Cavers | ........................ | 330/149 |
| 5,105,446 A | * | 4/1992 | Ravoalavoson et al. | .... | 375/296 |
| 5,107,520 A | * | 4/1992 | Karam et al. | ................ | 375/296 |
| 5,327,279 A | * | 7/1994 | Farina et al. | ................ | 398/147 |
| 5,481,389 A | * | 1/1996 | Pidgeon et al. | ............. | 398/208 |
| 5,798,674 A | * | 8/1998 | Fountain | ...................... | 332/149 |
| 5,798,854 A | * | 8/1998 | Blauvelt et al. | ............ | 398/194 |

* cited by examiner

Primary Examiner—Robert Pascal
Assistant Examiner—Joseph Chang
(74) Attorney, Agent, or Firm—Philip R. Wadsworth; Kent D. Baker

(57) ABSTRACT

An amplitude modulated source signal (102) is received, where this signal has a source frequency bandwidth and a source envelope. A dummy envelope is computed that would yield a constant if the dummy envelope and source envelope were to be combined. An amplitude modulated dummy signal (105) is generated, where this dummy signal exhibits the computed, dummy signal envelope and has a prescribed frequency bandwidth different than the source frequency bandwidth. The source and dummy signals are added to form a combined signal (113), which is directed to an input (114a) of a nonlinear circuit (114), that is, one that exhibits amplitude dependent nonlinearity. Signals of the dummy frequency bandwidth and any intermodulation products are filtered from the output, thereby providing a linearized output (118) corresponding to the original, source signal.

17 Claims, 5 Drawing Sheets

BLIND LINEARIZATION USING CROSS-MODULATION

BACKGROUND

1. Field

The present invention generally concerns a method of forcing a nonlinear circuit (that is, a circuit whose application of a given function varies with amplitude of the input signal) to apply its function to an amplitude-modulated source signal without such nonlinearity. Without modifying characteristics of the circuit itself, this is done by combining the amplitude modulated source signal with one or more dummy signals (one dummy signal for dominantly third order nonlinearities, two for fifth order, etc.) to provide a combined signal that will be treated linearly. The dummy signal(s), and other signals generated upon introduction of the dummy signal, are then filtered from the circuit's output.

2. Background

A circuit is "linear" when it applies the same function to input signals regardless of the input signals' characteristics. For instance, a circuit is free from amplitude-dependent nonlinearity if it applies the same function to input signals whether they have a small amplitude or a large amplitude. Conversely, a circuit exhibits amplitude-dependent nonlinearity if its function changes according to the amplitude of the input signal. One example of a circuit with amplitude-dependent nonlinearity is an amplifier that multiplies small amplitude input signals by ten, but with input signals of increasing amplitude, multiplies them by successively lesser numbers such 9.8, 9.7, 9.6, 9.5, and so on. The amplifier's behavior is therefore dependent upon the magnitude of its input signal.

Nonlinearity is an inherent property of many circuits as well as various circuits elements such as transistors, and it may even be desirable in different situations. In processing amplitude-modulated communication signals, however, nonlinear circuit elements are usually undesirable. Amplitude-modulated signals, by definition, express information by the manner in which the amplitude of a signal's envelope varies. Due to this amplitude-based variation, a nonlinear circuit will process an amplitude-modulated input signal inconsistently; the same function is not applied universally. One effect of this is that the input signal's frequency bandwidth is broadened. For example, an input signal that initially occupies a narrow frequency bandwidth ends up occupying a wider range of frequencies. Therefore, circuits with amplitude-dependent nonlinearity often increase the bandwidth of amplitude-modulated input signals.

This frequency spreading can cause problems. For example, a communication device's output signal, broadened by this nonlinear effect described above, may overlap into the frequency channel being used by another device of the same type. As a more particular example, one cordless telephone's signal may overlap into the frequency channel being used by another cordless telephone. This is called "interference" and can significantly degrade the other device's operation. Moreover, if the subject device is using a channel on the edge of the allocated frequency band for such devices, the device's output signal may even overlap into the frequency band for unrelated devices. Thus, a cordless phone may interfere with a different device that is not even a cordless phone.

Presently, engineers typically try to remove or compensate for nonlinearity in signal transmitters by techniques such as limiting the range of input signals for which a nonlinear circuit is used, and filtering the output of the nonlinear circuit to remove signals of unwanted frequencies. Other techniques are also known, such as predistortion linearization, feedforward linearization, and modulation feedback.

Still, these techniques are not quite adequate in all cases. For instance, problems still exist because predistortion requires an accurate model of the nonlinearity, feedforward requires precise and adaptive matching of RF circuits, and modulation feedback is prone to instability.

SUMMARY

A method of linearizing a circuit with amplitude-dependent nonlinearity ("nonlinear circuit") enables the circuit to apply its function without its inherent nonlinearity and without having to modify the circuit's operating characteristics. This is done by combining the amplitude-modulated source signal with a dummy signal to provide a combined signal that is treated linearly by the nonlinear circuit. The dummy signal and other signals generated by the introduction of the dummy signal are later filtered from the circuit's output.

According to a more particular aspect of the invention, the following operations are performed. Initially, an amplitude-modulated source signal, which has a source frequency bandwidth and a source envelope, is received. A dummy envelope is computed that would yield a constant if the source and dummy envelopes were to be combined in a predetermined way. An amplitude-modulated dummy signal, which exhibits the computed, dummy envelope and has a prescribed dummy frequency bandwidth different than the source frequency bandwidth, is generated. The source and dummy signals are added to form a combined signal, which is directed to an input of a nonlinear circuit. Signals of the dummy frequency bandwidth and other signals formed by the introduction of the dummy signal are filtered from the output, thereby providing a linearized output attributable solely to the source signal.

DETAILED DESCRIPTION

The nature, objectives, and advantages of the invention will become more apparent to those skilled in the art after considering the following detailed description in connection with the accompanying drawings.

Hardware Components & Interconnections

Introduction

Figure 1A:
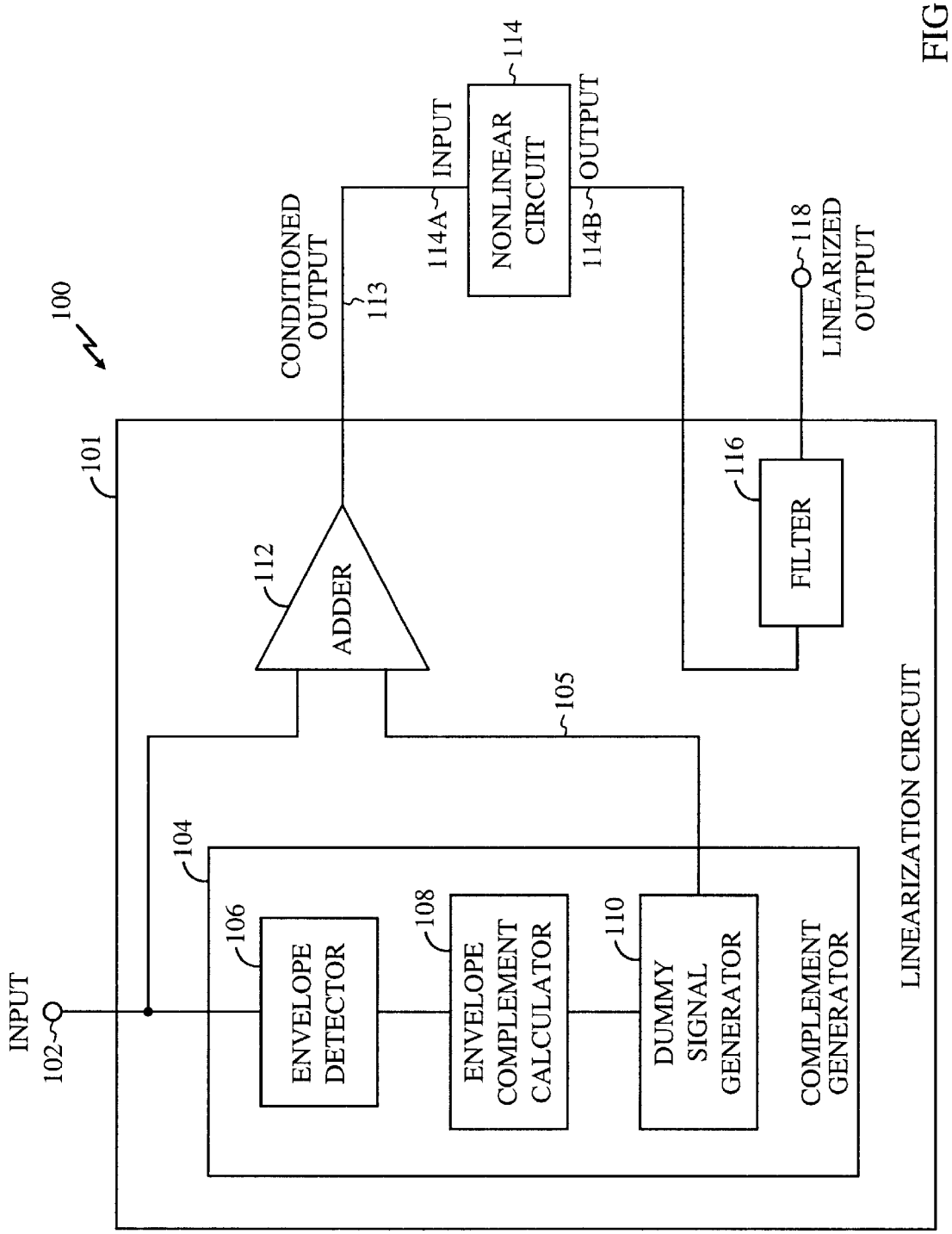
FIG. 1A is a block diagram of the hardware components and interconnections of exemplary linearization circuitry.

One aspect of the invention concerns a linearization apparatus, which may be embodied by various hardware components and interconnections, with one example being described by the linearization circuit 101 of FIG. 1A. The linearization circuit is illustrated in the context of an exemplary application environment 100, which includes a nonlinear circuit 114. In the exemplary application environment 100, various inputs and outputs are described, such as 102, 113, 114a, 114b, 118, etc. Depending upon the context, these reference numerals are utilized to refer to hardware input/output lines ("inputs" and "outputs"), as well as input signals and output signals present on such input/output lines. And, although the term "circuit" is used for ease of reference, the circuits described herein may be implemented by discrete electronics, printed circuit board traces, integrated circuitry, firmware, software, hardware, or a combination of any of the foregoing. The makeup of some exemplary subcomponents is described in greater detail below, with reference to an exemplary digital data processing apparatus, logic circuit, and signal bearing medium.

Conventionally, input signals (such as 102) are input directly to a nonlinear circuit (such as 114), and the nonlinear circuit simply processes the input signal and provides its output (at 114b). Instead of this known approach of providing the input signal 102 directly to the nonlinear circuit 114, one aspect of the present invention redirects the input signal 102 to a linearization circuit 101, which generates a conditioned output signal 113 that is input to the nonlinear circuit 114 instead of the input signal 102. And, instead of considering the nonlinear circuit 114's output 114b as the final output, additional components of the linearization circuit 101 are used to further process this output 114b to provide a final, linearized output 118. The linearized output 118 is free from nonlinear effects of the circuit 114 that would be present at 114b if the input signal 102 were provided directly to the circuit 114.

Nonlinear Circuit

The nonlinear circuit 114 applies a given function to signals at its input 114a and produces a resultant at output 114b. The nonlinear circuit 114 is nonlinear, however, since the given function varies with the amplitude of the signal arriving at input 114a. As a simple example, the nonlinear circuit 114 may seek to double the amplitude of its input signal 114a. In this case, if the input signal is 2 mV, the nonlinear circuit 114 produces an output of 4 mV. However, continuing with this example, performance of the nonlinear circuit 114 starts to degrade with input signals of greater amplitude. Instead of multiplying input signals by two, the nonlinear circuit 114 begins to multiply input signals by 1.95, then 1.9 for larger amplitude input signals, and then 1.85, and 1.80, etc. The circuit 114 therefore exhibits amplitude-dependent nonlinearity, since the function that it applies changes depending upon the amplitude of the input signal.

Advantageously, the present invention may be practiced without knowledge of the extent, behavior, or other specific characteristics of the nonlinear circuit 114's nonlinearity. In this sense, one aspect of the invention is "blind" linearization. Knowledge is only required of the nonlinear circuit 114's class of nonlinearity, and in particular, that the circuit exhibits amplitude dependent nonlinearity. Thus, the nonlinear circuit 114 produces AM-AM and AM-PM distortion, wherein the amplitude modulation (AM) of the input signal causes a nonlinear amplitude-modulation of the output signal, and/or the amplitude-modulation of the input signal causes nonlinear phase modulation (PM) of the output signal.

Without any intended limitation, some examples of the nonlinear circuit 114 include an amplifier, filter, isolator, RF element, mixer, etc.

Linearization Circuit

The linearization circuit 101 is utilized in conjunction with the nonlinear circuit 114 to force the nonlinear circuit 114 to provide a linear output. Rather than providing an input 102 directly to the nonlinear circuit 114, the linearization circuit 101 pre-processes the input 102 and provides the pre-processed conditioned output 113 to the nonlinear circuit 114; the linearization circuit 101 also post-processes the nonlinear circuit's output 114b, ultimately providing a linearized output 118. Accordingly, the linearization circuit 101 includes some pre-processing components complement generator 104 and adder 112 residing between the nonlinear circuit 114 and the input 102, and some post-processing filter components 116 residing between the nonlinear circuit 114 and the final linearized output 118.

As mentioned above, there are various pre-processing components between the input 102 and nonlinear circuit 114. These include a complement generator 104 and an adder 112. The complement generator 104 includes an envelope detector 106, an envelope complement calculator 108, and a dummy signal generator 110. The envelope detector 106 measures, quantifies, estimates, calculates, or otherwise determines the envelope of the signal arriving at the input 102. This is referred to as the source envelope. The envelope detector 106 may be implemented by any of various widely known envelope detectors, such as a circuit structure of one or more diodes, capacitors, resistors, etc. Alternatively, in an application where envelope information is already known, the source envelope description arrives at the complement generator 104 from another source (not shown), for example, in digital form.

The envelope complement calculator 108 calculates a "dummy" envelope that is complementary to the source envelope. In a broad sense, the dummy envelope is calculated so that, if added to the source envelope, the result would be a constant. Thus, in one basic implementation, the value of the dummy envelope at any time may be calculated by subtracting the source envelope from a constant. Computation of the dummy envelope is described in greater detail below.

In one example, the envelope complement calculator 108 may be constructed using discrete circuitry such as transistors. Alternatively, the envelope complement calculator 108 may be implemented by software, especially in the event that the envelope detector 106 is omitted and the source envelope description arrives in digital form.

The dummy signal generator 110 modulates the amplitude of a carrier signal to provide a dummy signal that is characterized by the dummy envelope. As a representative example, without any intended limitation, the dummy signal generator 110 may comprise an oscillator and a multiplier, where the multiplier computes the product of the carrier and the dummy envelope calculated by envelope complement calculator 108. This may be achieved by using, for example, polar modulation. In a different example, the dummy signal generator 110 may comprise a quadrature modulator, including circuitry to compute I and Q components based upon the computed dummy envelope and a multiplier to compute the product of such I and Q components. Regardless of the modulation scheme, the dummy signal 105 occurs at one or more frequencies (a frequency "bandwidth"), which intentionally differs from the source frequency bandwidth in order to aid in removing the dummy signal from the final linearized output 118 as discussed in greater detail below.

Output of the complement generator 104 at 105 therefore comprises a dummy signal whose envelope is described by the dummy envelope. This signal has a frequency bandwidth determined by the dummy signal generator 110. An adder 112 combines the dummy signal 105 with the original source signal 102. As mentioned above, then, the components 104, 112 constitute pre-processing components that condition the source signal 102 before it reaches the nonlinear circuit 114. The output of the pre-processing components is a conditioned output 113. This signal is fed to the nonlinear circuit 114, which processes its input 114a and provides an output at 114b.

As mentioned above, the linearization circuit 101 also includes various post-processing components between the nonlinear circuit 114 and the final linearized output 118. Namely, a filter 116 serves to remove any "intermodulation products," which comprises signals having the dummy frequency bandwidth, as well as signals created by the joint interaction of the input signal and the dummy signal with the nonlinearity. Thus, the final linearized output 118 only contains signals attributable to the source signal 102. The filter 116 may comprises one or more bandpass filters, for example.

Multiple Complement Generators

Figure 1B:
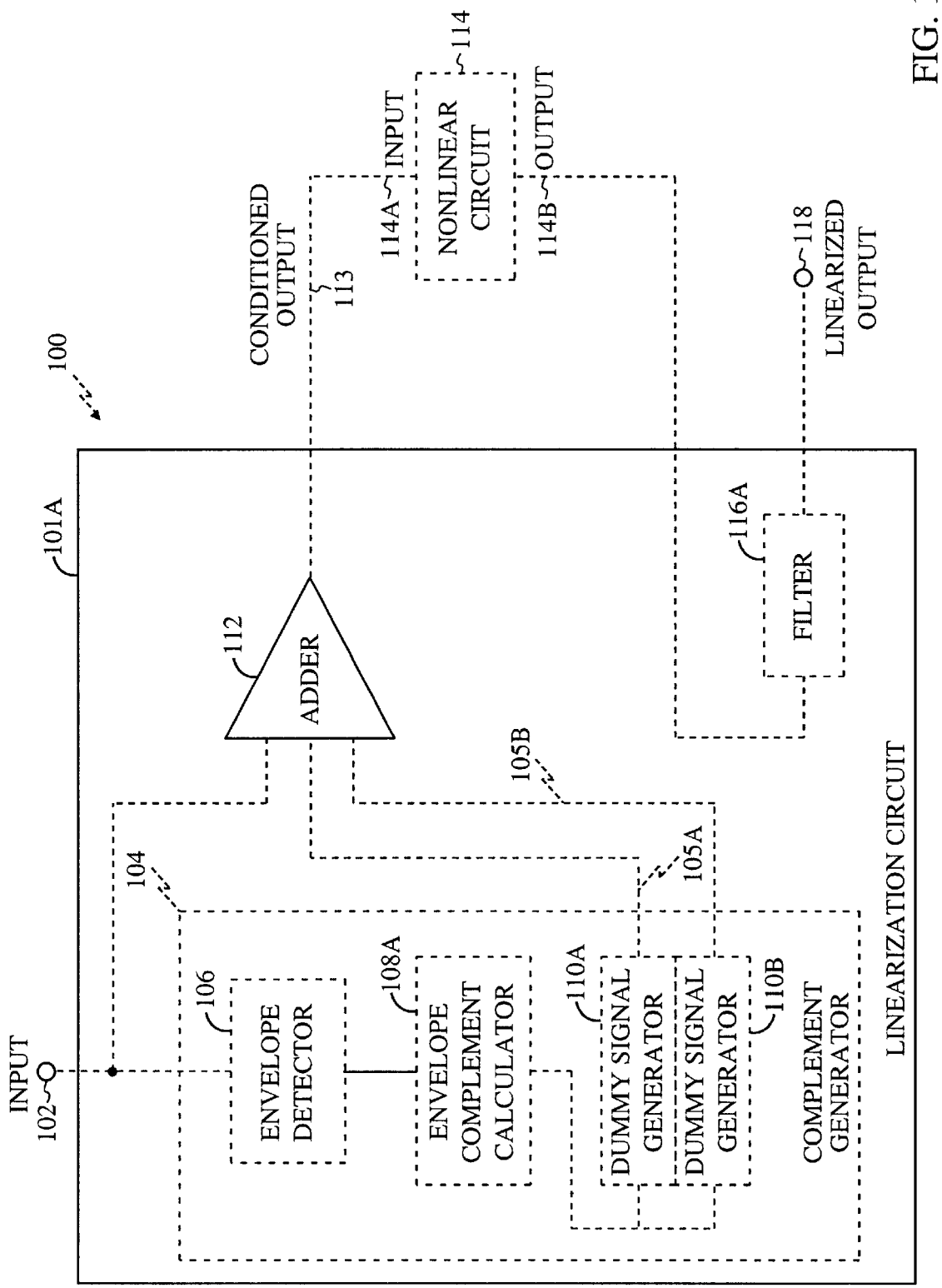
FIG. 1B is a block diagram of the hardware components and interconnections of linearization circuitry with multiple dummy signal generators.

Optionally, a linearization circuit 101a of different structure is contemplated to implement multiple dummy signal generators 110a and 110b, as shown in FIG. 1B. To the extent that components of the circuit 101a differ from those of the circuit 101 (FIG. 1A), they are given different reference numerals and discussed as follows. The envelope detector 106 performs the same function in FIGS. 1A and 1B. Namely, the envelope detector 106 measures, quantifies, estimates, calculates, or otherwise determines the source envelope.

Although the envelope complement calculator 108a operates in a generally similar fashion as the envelope complement calculator 108 of FIG. 1A, the envelope complement calculator 108 includes some additional functionality. Namely, the envelope complement calculator 108a calculates two dummy envelopes (rather than one), where these dummy envelopes are combinedly complementary to the source envelope. An exemplary approach to generating multiple dummy envelopes is discussed in greater detail below.

In FIG. 1B, there are multiple dummy signal generators 110a and 110b. Each dummy signal generator 110a, 110b modulates a different carrier signal to provide a dummy signal exhibiting a different one of the calculated dummy envelopes (shown below as $A_{de1}$ and $A_{de2}$). Like the single dummy signal generator 110, each dummy signal generator 110a, 110b in the embodiment of FIG. 1B may utilize polar or quadrature modulation, for instance.

Output of the dummy signal generators 110a, 110b, which comprises dummy signals on lines 105a, 105b, is directed to the adder 112. The adder 112 combines the dummy signals 105a, 105b with the source signal 102. Accordingly, the adder 112 provides a conditioned output 113, which has a constant or nearly constant envelope. This conditional output signal 113 is fed to the nonlinear circuit 114 at input 114a. The nonlinear circuit 114 processes the input 114a and provides an output at 114b.

Like the filter 116 of FIG. 1A, the filter 116a removes dummy signals (as well as signals created by the joint interaction of the input signal and the dummy signals) from the nonlinear circuit's output 114b. However, since the linearization circuit 101a utilizes multiple dummy signals 105a, 105b, the filter 116a is configured to remove signals of each dummy frequency bandwidth as well as any intermodulation products of such signals.

Exemplary Digital Data Processing Apparatus

As mentioned above, data processing entities such as envelope detectors, envelope complement calculators, dummy signal generators, adders, filters, or any one or more of their subcomponents may be implemented in various forms. One example is a digital data processing apparatus, as exemplified by the hardware components and interconnections of the digital data processing apparatus 200 of FIG. 2.

The digital processing apparatus 200 includes a processor 202, such as a microprocessor, personal computer, workstation, controller, microcontroller, state machine, or other processing machine, coupled to a storage 204. In the present example, the storage 204 includes a fast-access storage 206, as well as nonvolatile storage 208. The fast-access storage 206 may comprise random access memory ("RAM"), and may be used to store the programming instructions executed by the processor 202. The nonvolatile storage 208 may comprise, for example, battery backup RAM, EEPROM, flash PROM, one or more magnetic data storage disks such as a "hard drive," a tape drive, or any other suitable storage device. The apparatus 200 also includes an input/output 210, such as a line, bus, cable, electromagnetic link, or other means for the processor 202 to exchange data with other hardware external to the apparatus 200.

Despite the specific foregoing description, ordinarily skilled artisans (having the benefit of this disclosure) will recognize that the apparatus discussed above may be implemented in a machine of different construction, without departing from the scope of the invention. As a specific example, one of the components 206, 208 may be eliminated; furthermore, the storage 204, 206, and/or 208 may be provided on-board the processor 202, or even provided externally to the apparatus 200.

Logic Circuitry

In contrast to the digital data processing apparatus discussed above, a different embodiment of the invention uses logic circuitry instead of computer-executed instructions to implement various processing entities such as those mentioned above. Depending upon the particular requirements of the application in the areas of speed, expense, tooling costs, and the like, this logic may be implemented by constructing an application-specific integrated circuit (ASIC) having thousands of tiny integrated transistors. Such an ASIC may be implemented with CMOS, TTL, VLSI, or another suitable construction. Other alternatives include a digital signal processing chip (DSP), discrete circuitry (such as resistors, capacitors, diodes, inductors, and transistors), field programmable gate array (FPGA), programmable logic array (PLA), programmable logic device (PLD), and the like.

Operation

Having described the structural features of the present invention, the operational aspect of the present invention will now be described. As mentioned above, the operational aspect of the invention generally involves a method of forcing a nonlinear circuit to apply its function to an amplitude-modulated source signal in a linear fashion. Without modifying characteristics of the circuit itself, this is done by combining the amplitude-modulated source signal with a dummy signal to provide a combined signal that will be treated linearly. The dummy signal and any intermodulation products are then filtered from the circuit's output. These operations are discussed in greater detail below.

Signal-Bearing Media

Wherever any functionality of the invention is implemented using one or more machine-executed program sequences, such sequences may be embodied in various forms of signal-bearing media. In the con text of FIG. 2, such a signal-bearing media may comprise, for example, the storage 204 or another signal-bearing media, such as a magnetic data storage diskette 300 (FIG. 3), directly or indirectly accessible by a processor 202. Whether contained in the storage 206, magnetic data storage diskette 300, or elsewhere, the instructions may be stored on a variety of machine-readable data storage media. Some examples include direct access storage (e.g., a conventional "hard drive", redundant array of inexpensive disks ("RAID"), or another direct access storage device ("DASD")), serial-access storage such as magnetic or optical tape, electronic non-volatile memory (e.g., ROM, EPROM, flash PROM, or EEPROM), battery backup RAM, optical storage (e.g., CD-ROM, WORM, DVD, digital optical tape), paper "punch" cards, or other suitable signal-bearing media including analog or digital transmission media and analog and communication links and wireless communications. In an illustrative embodiment of the invention, the machine-readable instructions may comprise software object code, compiled from a language such as assembly language, C, etc.

Logic Circuitry

In contrast to the signal-bearing medium discussed above, some or all of the invention's functionality may be implemented using logic circuitry, instead of using a processor to execute instructions. Such logic circuitry is therefore configured to perform operations to carry out the method aspect of the invention. The logic circuitry may be implemented using many different types of circuitry, as discussed above.

Overall Sequence of Operation

Figure 4:
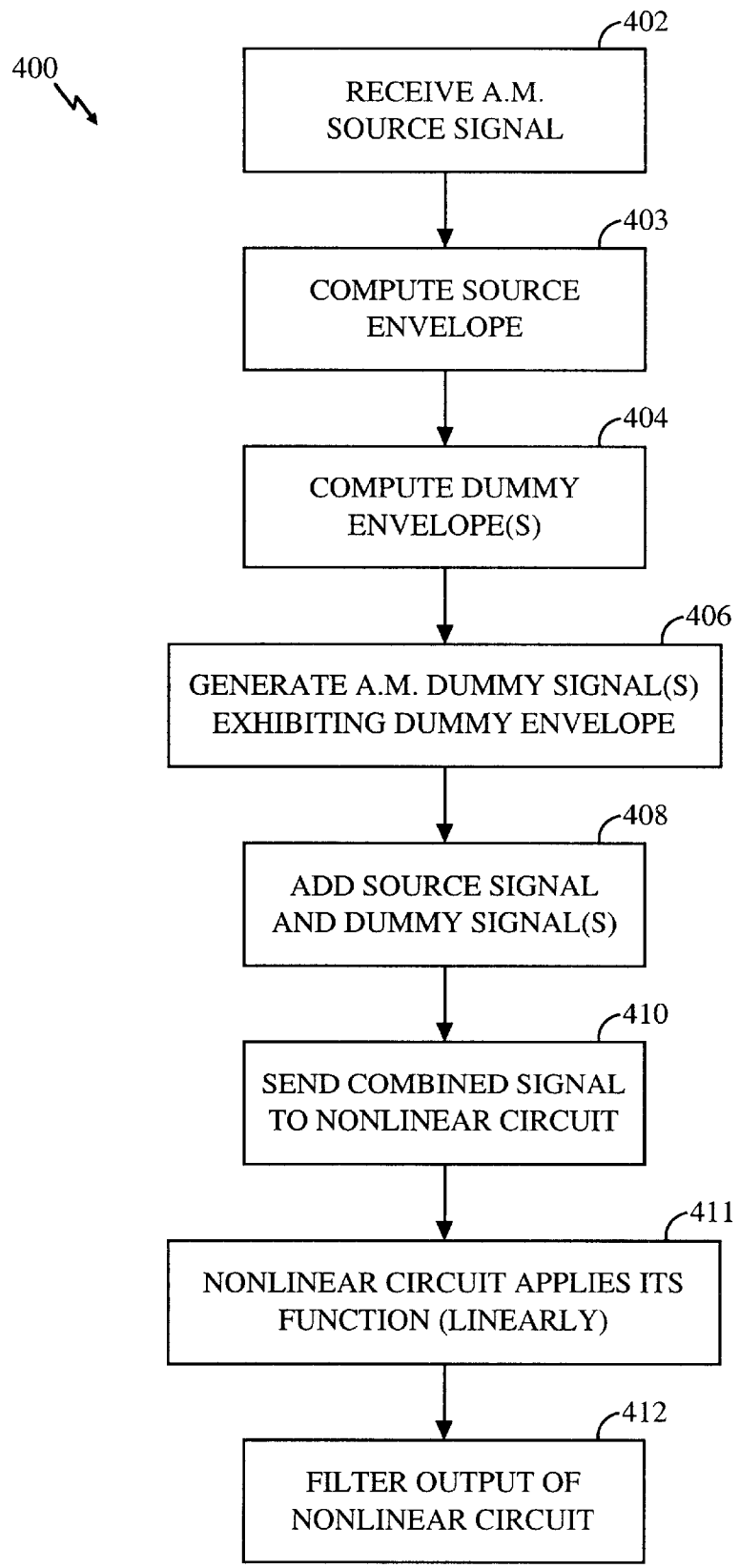
FIG. 4 is a flowchart showing an exemplary blind linearization operating sequence.

FIG. 4 shows a sequence 400 to illustrate an operational aspect of the present invention. For ease of explanation, but without any intended limitation, the example of FIG. 4 is described in the context of the environment 100 of FIG. 1A as described above.

In step 402, the linearization circuit 101 receives the source signal on the input 102. The source signal also goes to the adder 112. The source signal does not go to the nonlinear circuit 114, since the linearization circuit 101 is designed to perform certain pre-processing tasks to assist the nonlinear circuit 114 in processing the source signal in a linear fashion.

Figure 5A:
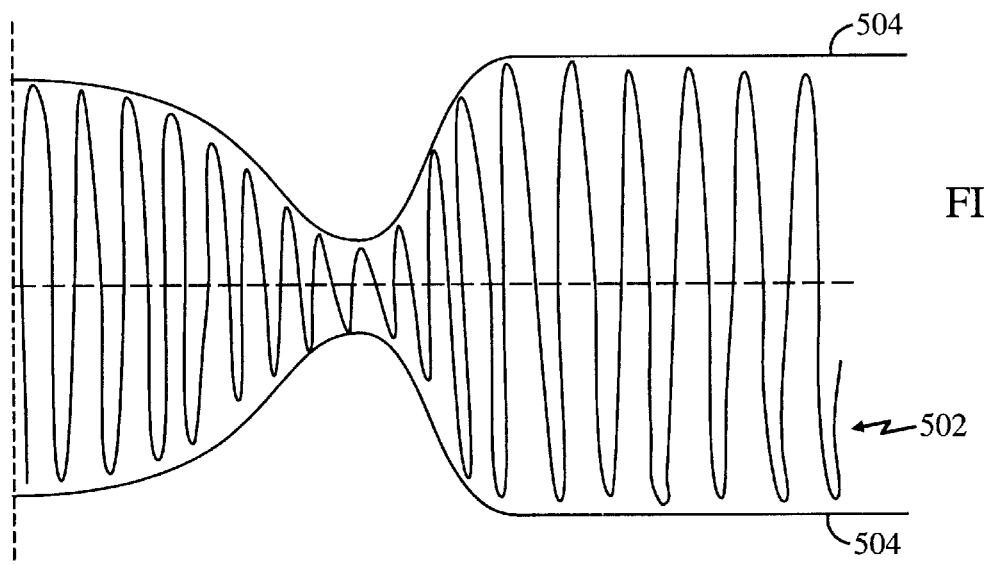
FIGS. 5A–5B are signal diagrams showing a source signal with source envelope and a dummy signal with dummy envelope, respectively.

FIG. 5A describes a representative source signal 502. The source signal 502 comprises an amplitude-modulated signal of a single frequency, although the techniques of this disclosure may be applied to source signals of a variety of frequency/phase modulation. The source signal is said to have a source frequency bandwidth, which encompasses a single frequency or multiple frequencies.

In step 403, the envelope detector 106 computes a source envelope representative of the source signal 102. FIG. 5A depicts the envelope of the source signal 502 at source envelope 504. The envelope detector 106 works by measuring, quantifying, estimating, calculating, or otherwise determining the envelope of the signal arriving at the input 102. The detector 106's output is called the "source envelope," and serves to describe the envelope. 504 with analog waveform(s), digital information, or any other data depending upon the manner in which the detector 106 and/or complement calculator 108 are implemented.

Step 403 is optional, however, as the envelope detector 106 may be omitted in the event that envelope information is already known. For instance, depending upon the application, data and/or signals describing the envelope may already be available from a computer, analog circuit, or other origin separate from the linearization circuit 101. In this case, the input 102 need not be coupled to the complement generator 104, as the source envelope description arrives at the complement calculator 108 directly from the point of its separate origin.

Figure 5B:
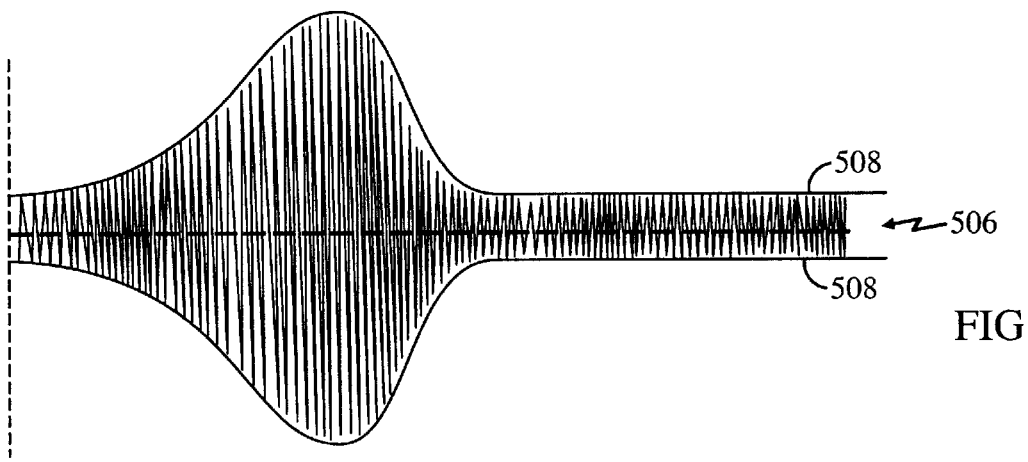

In step 404, the envelope detector 106 computes a dummy envelope based upon the source envelope 504 as computed by the envelope detector 106 (step 403) or as received from another point of origin. Broadly, the dummy envelope is computed to yield a predetermined constant if the source envelope 504 and dummy envelopes, at any instant of time, were to be combined in a specific way. FIG. 5B shows an exemplary dummy envelope 508 that is calculated based upon the source envelope 504.

As a more particular example, the dummy signal envelope is computed such that a predetermined constant always results when the source envelope and dummy envelope are processed by predetermined formulas (described below) and the processed signals added. One embodiment of such a predetermined formula is expressed by Equations 1 and 2, below.

$$K = A_{se}^2 + 2*A_{de}^2 \qquad \text{Eq. 1}$$

where: K=a constant.

$A_{se}$=the amplitude of the source envelope.

$A_{de}$=the amplitude of the dummy envelope.

In other words, the envelope complement calculator 108 in this embodiment computes the amplitude of the dummy envelope so as to satisfy Equation 2, below.

$$A_{de} = \text{sqrt}[0.5*(K - A_{se}^2)] \qquad \text{Eq. 2}$$

In step 406, the dummy signal generator 110 modulates a carrier signal to provide a dummy signal exhibiting the calculated dummy envelope. In the presently illustrated example, FIG. 5B shows the dummy signal as 506. The generator 110 may generate the carrier signal, for example using an oscillator, or it may receive the carrier signal from elsewhere. The carrier signal's frequency bandwidth (meaning its single frequency, or frequency range if some frequency/phase modulation is used) is different than the frequency bandwidth of the source signal 102. The carrier signal's frequency bandwidth is referred to as the "dummy frequency." Moreover, the operation of downstream filters (discussed below) may be simplified by judiciously selecting the carrier signal's frequency bandwidth so that the post-non-linear-circuit products can be readily distinguished (and removed) from the source signal 102. To further simplify the process of later removing artifacts of the dummy signal from the nonlinear circuit 114's output 114b, one approach is to avoid any frequency/phase modulation of the carrier signal.

Carrier modulation of step 406 may occur by quadrature modulation, polar modulation, or another of the many techniques familiar to artisans or ordinary skill in the applicable art.

In step 408, the adder 112 adds the source signal 502 (present on the input 102) and the dummy signal 506 (present on the output 105 of the dummy signal generator 110). The output of the adder 112 may also be referred to as a "conditioned" signal 113, or a "combined" signal. Since its amplitude is now regulated, the signal 113 is ready to be processed by the nonlinear circuit 114. Accordingly, in step 410, the adder 112 sends the conditioned output to the nonlinear circuit 114.

In step 411, the nonlinear circuit 114 applies its function to its input 114a, that is, the conditioned signal 113. For instance, if the nonlinear circuit 114 is an amplifier, it amplifies the input 114a. If the nonlinear circuit 114 is a filter, it filters the input 114a. However, since the source signal 502 has been conditioned by addition of the dummy signal 506, the nonlinear circuit 114 is prevented from producing any amplitude dependent changes ("nonlinearities"). Thus, the nonlinear circuit 114's output 114b is linearized.

However, the output 114b still contains artifacts of the dummy signal 506. Thus, in step 412 the filter 116 acts to remove any signals in the output 114b corresponding to the carrier signal of the generator 110, namely, the dummy signal 506. The filter also removes any "intermodulation products," which means signals created by the joint interaction of the input signal and the dummy signal with the nonlinearity. Thus, after filtering, the only signals remaining in the output 118 are signals attributable to the source signal 102. However, since the source signals 102 (combined with the dummy signal) was linearly processed by the circuit 114, the output 118 is linearized. The output 118 of the filter 116 represents the final, linearized output of the linearization circuit 101.

Multiple Dummy Signal Embodiment

The foregoing technique, where a single-dummy-signal is added, is targeted at nonlinearities of predominantly third order. Even-order nonlinearities (e.g., second, fourth, sixth, etc.) are not problematic. However, for fifth order nonlinearities, the linearization circuit 101a is utilized because it includes two dummy signal generators. A greater number of dummy signal generators may be used for even higher orders of nonlinearity, e.g., seventh, ninth, etc.

In order to operate the linearization circuit 101a, many of the same operations 400 are performed as described above. Differences, to the extent they occur and require description, are explained below. First, although the envelope complement calculator 108a performs step 404 in a generally similar fashion as the envelope complement calculator 108 of FIG. 1A, the calculator 108 performs additional duties. Namely, the envelope complement calculator 108a calculates two dummy envelopes in step 404 (rather than one), where these dummy envelopes in combination are complementary to the source envelope 504. This concept may be further extended to three, four, or any number of dummy envelopes that are (in combination) complementary to the source signal 102. Multiple dummy envelope calculation is explained in greater detail in the APPENDIX included herein, with the example of two dummy envelopes being shown.

Another difference in the multi-dummy-signal embodiment is in step 406. Namely, each of the generators 110a, 110b (FIG. 1B) modulates a different carrier signal to provide a dummy signal exhibiting one of the calculated dummy envelopes ($A_{de1}$ and $A_{de2}$). The carrier signals of the generators 110a, 110b have different frequency bandwidths from each other because at common frequencies their envelopes add, whereas the application calls for two distinct signals (with prescribed envelopes) that add. Each carrier signal's frequency (or frequencies, if some phase modulation is used) is different than the frequency bandwidth of the source signal 102 to simplify the subsequent removal of the corresponding dummy signal. To further simplify the process of removing artifacts of the dummy signals from the nonlinear circuit 114's output 114b, each carrier signal may occur at a single frequency, that is, without any phase modulation. Like the single-dummy-signal embodiment, each dummy signal generator 110a, 110b may utilize modulation such as polar or quadrature modulation.

Another difference in the multi-dummy signal embodiment occurs in step 408. Here, the adder 112 combines outputs 105a, 105b from multiple different dummy signal generators 110a, 110b with the source signal 102. As another difference, the filter 116a in step 412 must filter out all dummy signals, namely, each frequency of dummy signal from each of the generators 110a, 1110b. As with the single-dummy-signal embodiment, any applicable intermodulation products are also filtered.

Other Embodiments

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC.

Moreover, the previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but it is to be accorded the widest scope consistent with the principles and novel features disclosed herein.

The word "exemplary" is used herein to mean "serving as an example, instance, or illustration." Any embodiment described herein as "exemplary" is not necessarily to be construed as preferred or advantageous over other embodiments.

1 Executive Summary

A circuit increases a signal's bandwidth when its gain depends on the signal's amplitude. Adding a linearizing signal of related amplitude, but with unrelated phase, to the input can reduce this dependence. Because the phase is unrelated, the linearizing signal can be at any convenient frequency. The linearizing signal causes intermodulation products, but these can be filtered if the signal frequencies are well chosen. The method is 'blind' in the sense that, apart from the usual AM-AM and AM-PM[1] assumption, no knowledge of the nonlinearity is assumed.

The report examines essential principles. While practical aspects are given due consideration, detailed implementation issues are not addressed.

2 Introduction

Consider an input signal to a nonlinear circuit (a transmitter amplifier, for example), given by $$x = A(t)\cos(\phi(t) + \omega_0 t). \tag{1}$$

Here, $A(t)$ is the amplitude modulation, $\phi(t)$ is the phase modulation, and $\omega_0$ is the center frequency. Using the complex low-pass form, we have $$\tilde{x} = A(t)\exp i\phi(t). \tag{2}$$

The output signal is given by $$y = G(A)A(t)\cos(\phi(t) + \omega_0 t + \gamma(A)), \tag{3}$$

Here, $G(A)$ governs the amplitude response (AM-AM) and $\gamma(A)$ governs the phase response (AM-PM). In complex low-pass form, the output is $$\tilde{y} = G(A)\exp(i\gamma(A))\tilde{x}, \tag{4}$$

---

[1] AM-AM = amplitude-modulation to amplitude-modulation. AM-PM = amplitude-modulation to phase-modulation.

where the complex gain is $$CG = G(A)\exp i\gamma(A). \tag{5}$$

The complex gain can be represented as a simple polynomial[2]

$$CG = k_1 + k_3|\tilde{x}|^2 + k_5|\tilde{x}|^4 + \ldots + k_N|\tilde{x}|^{N-1}. \tag{6}$$

Here $k_1, k_3$ and $k_5$ are related to the gain $G$ (dB) and output third-order and fifth order intercept points (dBW, for $x$ in Volts) by $$|k_1| = 10^{G/20}, \tag{7}$$

$$|k_3| = \frac{2}{3R_0} 10^{3G/20 - IP3/10}, \tag{8}$$

$$|k_5| = \frac{2}{5R_0} 10^{G/4 - IP5/5}, \tag{9}$$

where $R_0$ is the input/output resistance [Ha81]. Similar relationships with higher order intercept points may be derived. This model assumes that the gain and nonlinearity are not functions of frequency — a reasonable assumption as long as the frequencies involved are not too widespread.

3 Linearization by Cross-modulation

In this section we explain how to linearizes the gain of the desired signal, $T(t)$ say, by adding one or more *linearizing* signals at the input of the nonlinearity. The linearizing signals are related in amplitude to $T(t)$, but not in phase. Furthermore, we assume that the added signal, or signals, are positioned in frequency so that the various intermodulation products can be filtered — leaving $T(t)$ unaffected.

For the most general case considered here, a composite of three signals forms the input to the nonlinearity. First, $\tilde{T}(t) = A_T(t)\exp i\phi_T(t)$ is the signal that we wish to linearly amplify. Second, $\tilde{L}(t) = A_L(t)\exp i\phi_L(t)$, is a signal to linearizes the amplification — principally reducing the third-order nonlinearity. Finally, $\tilde{M}(t) = A_M(t)\exp i\phi_M(t)$ may be added to reduce both the third and fifth order nonlinearity. Thus,

---

[2] The basis functions should, perhaps, be chosen with respect to the input signal [Blachman79].

*Blind Linearization Using Cross-Modulation*

$$\tilde{x} = A_T(t)\exp i\phi_T(t) + A_L(t)\exp i\phi_L(t) + A_M(t)\exp i\phi_M(t). \quad (10)$$

Using equation (6), the third order output term (neglecting the coefficient $k_3$) is $$|\tilde{x}|^2 \tilde{x} = \begin{array}{l} 2A_T^2 A_L \exp i(2\phi_T - \phi_L) + \\ 2A_T^2 A_M \exp i(2\phi_T - \phi_M) + \\ 2A_L^2 A_M \exp i(2\phi_L - \phi_M) + \\ 2A_L^2 A_T \exp i(2\phi_L - \phi_T) + \\ 2A_M^2 A_T \exp i(2\phi_M - \phi_T) + \\ 2A_M^2 A_L \exp i(2\phi_M - \phi_L) + \\ A_T A_L A_M \exp i(-\phi_T + \phi_L + \phi_M) + \\ A_T A_L A_M \exp i(\phi_T - \phi_L + \phi_M) + \\ A_T A_L A_M \exp i(\phi_T + \phi_L - \phi_M) + \\ 2A_L^2 A_T \exp i\phi_T + \\ 2A_M^2 A_T \exp i\phi_T + \\ 2A_M^2 A_L \exp i\phi_L + \\ 2A_T^2 A_L \exp i\phi_L + \\ 2A_T^2 A_M \exp i\phi_M + \\ 2A_L^2 A_M \exp i\phi_M + \\ A_T^3 \exp i\phi_T + \\ A_L^3 \exp i\phi_L + \\ A_M^3 \exp i\phi_M \end{array} \begin{array}{l} \text{Intermodulation} \\ \\ \\ \\ \\ \\ \text{Triple-Beat} \\ \\ \\ \text{Cross-Modulation} \\ \\ \\ \\ \\ \text{Self-Modulation} \end{array} \quad (11)$$

The terms that effect the amplification of $T(t)$ are the coefficients of $\exp(i\phi_T)$ — without either $\exp(i\phi_L)$ or $\exp(i\phi_M)$. For the moment we set $A_M = 0$, so that the complex gain of $T(t)$ is $$CG_T = k_1 + k_3(A_T^2 + 2A_L^2). \quad (12)$$

The contribution from $A_L(t)$ is due to *cross-modulation*. To linearizes the gain of $T(t)$, we set $$A_T^2 + 2A_L^2 = K_1 = \text{constant}.\tag{13}$$

This procedure is 'blind' in the sense that no knowledge of the third order nonlinearity coefficient, $k_3$, is required.

While equation (13) removes the effect of $k_3$ on the third order nonlinearity output, it also spreads the influence of the other coefficients, so that the new complex gain of $T(t)$ is (for example, for $N = 7$)

$$CG_T = k_1' + k_3' A_T^2 + k_5' A_T^4 + k_7' A_T^6,\tag{14}$$

where, $$k_1' = k_1 + K_1 k_3 + \frac{3}{4} K_1^2 k_5 + \frac{1}{2} K_1^3 k_7,\tag{15}$$

$$k_3' = \frac{3}{2} K_1 k_5 + 3 K_1^2 k_7,\tag{16}$$

$$k_5' = \frac{-5}{4} k_5 - \frac{3}{2} K_1 k_7,\tag{17}$$

$$k_7' = -k_7.\tag{18}$$

The new linear gain, $k_1'$ in equation (15), is influenced by all the original coefficients, $k_1, k_3, k_5, k_7$. The new third order coefficient, $k_3'$, is not influenced by the original third order coefficient, $k_3$ – but *is* affected by $k_5$ and $k_7$. Similarly, $k_5'$ now has a contribution from $k_7$. The new seventh order coefficient, $k_7'$, is unaffected apart from its sign.

For the method to improve the linearity, despite the increased influence of the higher order coefficients, $K_1$ must be as small as possible, and the nonlinearity should be dominantly third order.

As an example, we consider the following commonly quoted nonlinearity [Saleh81], $$CG = \frac{k_1}{1 + A_T^2} \exp\left( j \frac{\pi}{3} \frac{A_T^2}{1 + A_T^2} \right).\tag{19}$$

The gain and phase of $CG$ appear in figures 1(a) and 2(a). When expanded in a Taylor series about $A_T = 0$, with 15 dB of linear gain, we find $$k_1 = 5.623$$
$$k_3 = -5.623 + j5.888$$
$$k_5 = 2.540 - j11.777 \quad (20)$$
$$k_7 = 3.627 + j16.589$$

Here we have assumed $K_1 = 0.2$, which corresponds to a maximum peak amplitude of $A_T$ of 0.447 Volts.

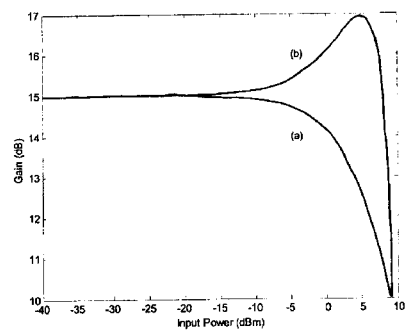

Figure 1 Complex gain magnitude: (a) equation (19), (b) 5$^{th}$ order nonlinearity.

From equations (15) to (18), we find the modified coefficients of the nonlinearity to be $$k_1' = 4.589 + j0.891$$
$$k_3' = 1.197 - j1.542$$
$$k_5' = -4.263 + j9.744 \quad (21)$$
$$k_7' = -3.627 - j16.589$$

For nonlinearities with gain compression, the power of the added linearizing signal reduces the overall gain. Hence $|k_1'|$ is slightly smaller than $|k_1|$. It is straightforward to calculate the improvement in third order intercept to be 6.2 dB. To ensure that, in improving the third order nonlinearity, the other terms have not been overly aggravated we simulate the nonlinearity of equation (19) with an IS-95 CDMA waveform.

Blind Linearization Using Cross-Modulation

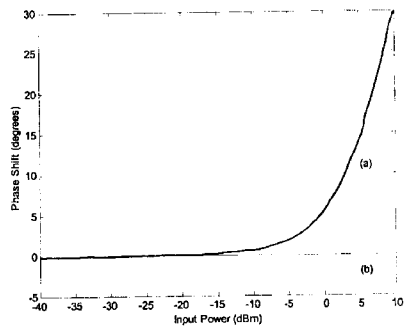

Figure 2:
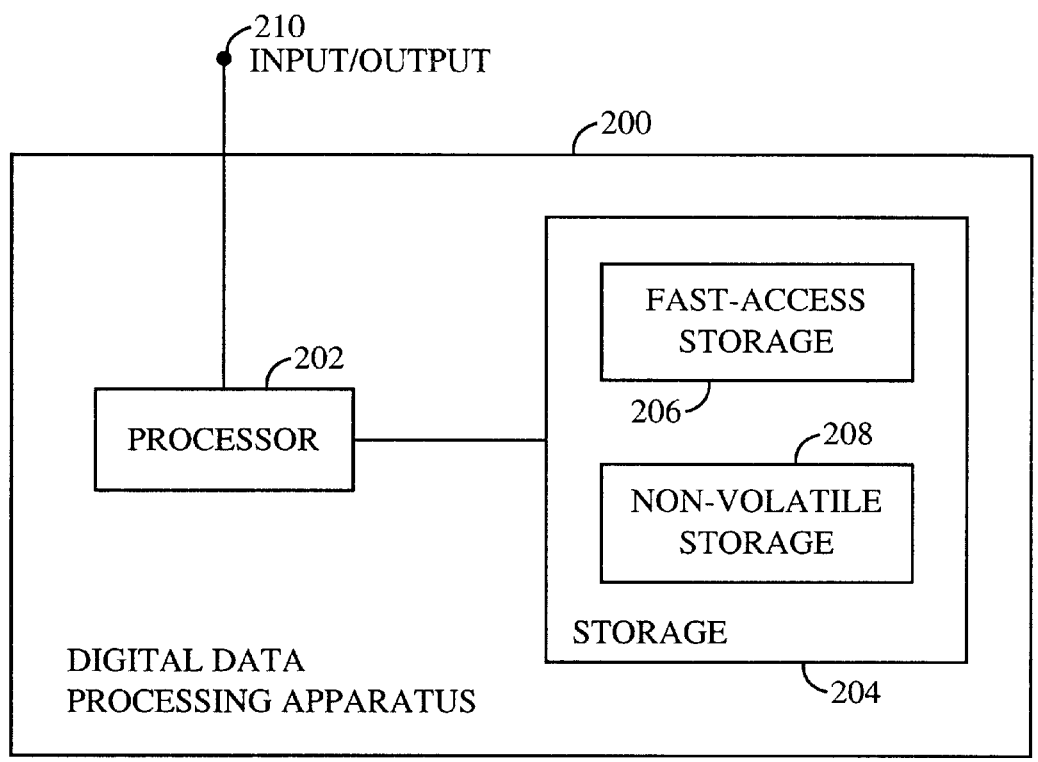
FIG. 2 is an exemplary digital data processing machine.

Figure 2 Complex gain phase shift: (a) equation (19), (b) linear phase.

We consider a typical digital wireless transmitter architecture. Random binary data is mapped to symbols, filtered, and converted to an analog signal. Although OQPSK is used for the transmitter signal the technique can be applied to any signaling format. Independent 'm'-sequences of length $2^{19} - 1$ supply the raw in-phase and quadrature binary data. The data is mapped to the OQPSK constellation and then interpolated at four times the input rate by the 'pulse-shaping' filter[3]. A zero-order hold (ZOH) follows with 128 samples per 'hold' to represent the analog waveform. The output of the ZOH is passed to the reconstruction filter[4]. The output of the reconstruction filter drives the complex gain of equation (19).

Figure 3:
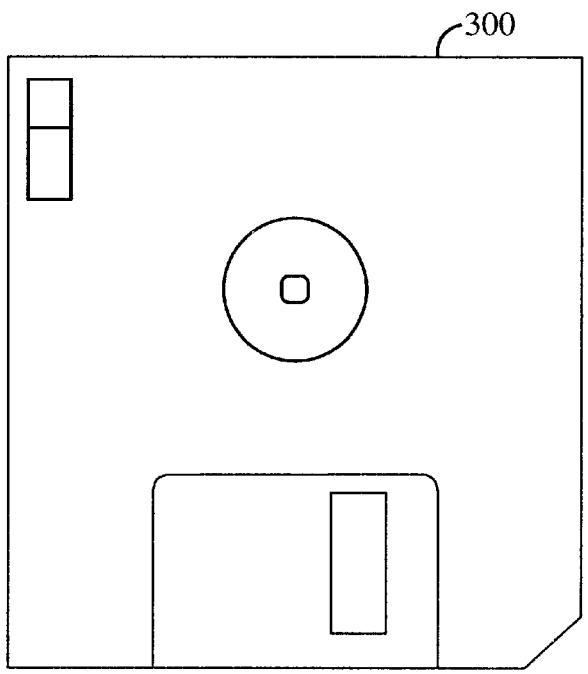
FIG. 3 is an exemplary signal bearing medium.

Figure 3 shows the output power spectral density (PSD). The PSD is estimated using Welch's method with sample length $2^{15}$ (Hanning) windowed periodograms [Oppenheim89]. Anticipating an application to CDMA systems, the frequency is given in units of the spreading, or 'chip', frequency, $f_{CHIP}$.

Both the linearized and un-linearized outputs of the nonlinearity are shown. The output power is 11 dBm in both cases. The input power has been increased 1 dB for the linearized case, as the linearizing signal reduces the gain of the nonlinearity. The output power of the linearizing signal us 15.2 dBm. The power in the first adjacent channel is improved by 10-15 dB, while the power in the second adjacent channel is degraded by 4-5 dB. In practice, whether this is beneficial will depend on the nonlinearity and the requirements in the neighboring channels.

---
[3] Adopted, for convenience, from TIA/EIA IS-95, "Mobile Station – Base Station Compatibility Standard for Dual-Mode Wideband Spread-Spectrum Cellular Systems", Telecommunications Industry Association. July, 1993..
[4] Chebyshev, type-II, $5^{th}$ order, stop-band 80 dB down at 3/256 of the sampling frequency Blind Linearization Using Cross-Modulation Figure 4 shows an expanded view of the power spectral density. The linearizing signal ('L') has been placed relatively close to the wanted signal ('T') to minimize the sampling requirements of the simulation. In practice, the linearizing signal's frequency should be chosen to ease filtering requirements.

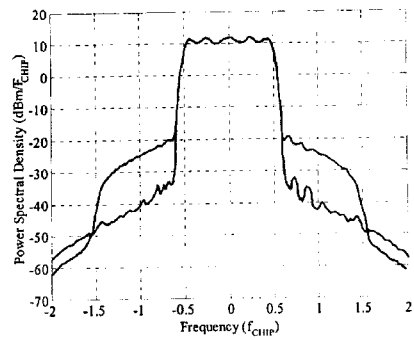

Figure 3 Power spectral density of the nonlinearity output with and without the added linearizing signal.

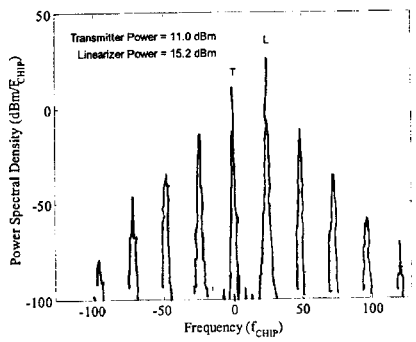

Figure 4 Power spectral density of the nonlinearity output: wide view showing wanted signal (T) and linearizing signal (L).

Blind Linearization Using Cross-Modulation

With the aid of a second linearizing signal, $M(t) = A_M(t)\exp i\phi_M(t)$, it is possible to further improve the linearity. Just as the first added signal removes the contribution of the third order coefficient, a second added signal can be added to remove the effect of the fifth order coefficient.

Equation (13) becomes a constraint on both $A_L$ and $A_M$ $$A_T^2 + 2(A_L^2 + A_M^2) = K_1. \tag{22}$$

To remove the contribution of the fifth order coefficient, $k_5$, we require $$A_T^4 + 6A_T^2(A_L^2 + A_M^2) + 3(A_L^2 + A_M^2)^2 + 6A_L^2 A_M^2 = K_2. \tag{23}$$

Equations (22) and (23) must be met simultaneously. To this end it is convenient to define $$P_1 = A_L^2 + A_M^2 = \frac{1}{2}(K_1 - A_T^2), \tag{24}$$

$$P_2 = A_L^2 A_M^2 = \frac{1}{6}\left(-A_T^4 - 6A_T^2 P_1 - 3P_1^2 + K_2\right), \tag{25}$$

from which we may solve for the two linearizing signals $$A_L^2 = \frac{P_1}{2} \pm \sqrt{\frac{P_1^2}{4} - P_2}, \tag{26}$$

$$A_M^2 = P_1 - A_L^2. \tag{27}$$

As both $A_L$ and $A_M$ must be greater than or equal to zero at all times, we also require $$\frac{P_1^2}{4} > P_2 \tag{28}$$

and $$P_2 > 0 \tag{29}$$

from which we deduce $$A_T^4 - \frac{6}{7}K_1 A_T^2 - \frac{9}{7}K_1^2 + \frac{8}{7}K_2 < 0 \tag{30}$$

and $$A_T^4 - \frac{6}{5}K_1 A_T^2 - \frac{3}{5}K_1^2 + \frac{4}{5}K_2 > 0 \tag{31}$$

Blind Linearization Using Cross-Modulation which must hold for all values of $A_r$. One solution for $K_1$ and $K_2$ that satisfies equations (30) and (31) is $$K_1 = \frac{\max(A_j^2)}{\frac{3}{5} - \sqrt{\frac{21}{350}}} \quad (32)$$

$$K_2 = \frac{63}{56} K_1^2 \quad (33)$$

This approach is suited to nonlinearities with gain expansion, as, with gain compression, the power in $L(t)$ and $M(t)$ (as determined by $K_1$ and $K_2$) decreases the overall gain, and reduces the output power. If the input power is increased to compensate, then the gain may reduce still further.

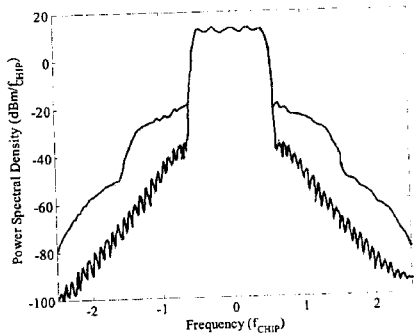

Figure 5 Power spectral density of the nonlinearity output with two added linearizing signals: close-up of wanted signal.

Figure 5 shows the power spectral density at the output of the nonlinearity with both $L(t)$ and $M(t)$ added at the input. The power of the wanted signal is 12 dBm. The linearizing signals, $L(t)$ and $M(t)$, are not shown but have output powers of 16.6 dBm 20.6 dBm respectively. In this case the nonlinearity (shown in figure 1(b) and figure 2(b)) *only* has first, third and fifth order terms — so the linearized spectrum is nearly ideal. The complex gain of equation (19) was not used, as with both a high-order nonlinearity and input signals at three frequencies, the intermodulation products are extensive and difficult

*Blind Linearization Using Cross-Modulation* to manage within the restricted simulation bandwidth. Therefore, figure 5 is optimistic as it does not include the influence of seventh and higher order terms.

In principle, more signals may be added to achieve higher orders of compensation. However, the benefit may diminish rapidly, as the power required for the linearizing signals increases.

4 Conclusion

A technique to linearizes a circuit by adding one or more signals has been introduced. The method does not assume any knowledge of the strength of the nonlinearity. However, some mild constraints on the nonlinearity (such that it is predominantly third order) will be required in practice.

5 References

[Blachman79] Blachman, N.M., "The Output Signals and Noise from a Nonlinearity with Amplitude-Dependent Phase Shift", IEEE Transactions on Information Theory, Vol. IT-25, No. 1, January 1979, 77-79.

[Ha81] Ha, T.T., "Solid State Microwave Amplifier Design", John Wiley and Sons, 1981.

[Oppenheim89], Oppenheim, A.V. and Schafer, R.W., " Discrete-Time Signal processing", Prentice-Hall, 1989.

[Saleh81] Saleh, A.A.M, "Frequency Independent and frequency-dependent models of TWT amplifiers," IEEE

What is claimed is:

1. A linearization method, comprising operations of:

receiving an amplitude modulated source signal of a source frequency bandwidth and exhibiting a source envelope;

computing a dummy envelope that would yield a predetermined constant when the source and dummy envelopes were to be combined;

creating an amplitude modulated dummy signal exhibiting the dummy envelope and occurring at a dummy frequency bandwidth, where the dummy frequency bandwidth differs from the source frequency bandwidth;

adding the source signal and the dummy signal to form a combined signal;

directing the combined signal to an input of a processing module whose output exhibits amplitude dependent nonlinearity;

filtering signals including signals of the dummy frequency bandwidth from the output to provide a linearized output.

2. The method of claim 1, the computing operation comprising computing a dummy envelope that would yield a predetermined constant if the source and dummy envelopes were to be added.

3. The method of claim 1, the computing operation comprising computing a dummy envelope that would yield a predetermined constant if the source and dummy envelopes were to be processed by predetermined formulas and the processed envelopes are added.

4. The method of claim 3, the predetermined formulas comprising:

squaring the source signal envelope;

squaring the dummy signal envelope and then doubling the squared dummy signal envelope.

5. The method of claim 1, where:

the operation of computing a dummy envelope comprises computing multiple dummy envelopes that would yield a predetermined constant if the source and all dummy envelopes were to be combined;

the operation of creating an amplitude modulated dummy signal comprises creating multiple amplitude modulated dummy signals exhibiting corresponding ones of the multiple dummy envelopes each occurring at a dummy frequency bandwidth that differs from the source frequency bandwidth;

the adding operation comprises adding the source signal and all the dummy signals to form the combined signal;

the filtering operation comprises filtering signals including signals of all dummy frequency bandwidths from the output to provide a linearized output.

6. An apparatus comprising circuitry of multiple interconnected electrically conductive elements configured to perform operations to linearize output of a processing module with amplitude dependent nonlinearity, the operations comprising:

receiving an amplitude modulated source signal of a source frequency bandwidth and exhibiting a source envelope;

computing a dummy envelope that would yield a predetermined constant if the source and dummy envelopes were to be combined;

creating an amplitude modulated dummy signal exhibiting the dummy envelope and occurring on a dummy frequency bandwidth, where the dummy frequency bandwidth differs from the source frequency bandwidth;

adding the source signal, and the dummy signal to form a combined signal;

directing the combined signal to an input of a processing module whose output exhibits amplitude dependent nonlinearity;

filtering signals including signals of the dummy frequency bandwidth from the output to provide a linearized output.

7. The apparatus of claim 6, the computing operation comprising computing a dummy envelope that would yield a predetermined constant if the source and dummy envelopes were to be added.

8. The apparatus of claim 6, the computing operation comprising computing a dummy envelope that would yield a predetermined constant if the source and dummy envelopes were to be processed by predetermined formulas and the processed envelopes were to be added.

9. The apparatus of claim 8, the predetermined formulas comprising:

squaring the source signal envelope;

squaring the dummy signal envelope and then doubling the squared dummy signal envelope.

10. The apparatus of claim 6, where:

the operation of computing a dummy envelope comprises computing multiple dummy envelopes that would yield a predetermined constant if the source and all dummy envelopes were to be combined;

the operation of creating an amplitude modulated dummy signal comprises creating multiple amplitude modulated dummy signals exhibiting corresponding ones of the multiple dummy envelopes each occurring at a dummy frequency bandwidth that differs from the source frequency bandwidth;

the adding operation comprises adding the source signal and all the dummy signals to form the combined signal;

the filtering operation comprises filtering signals including signals of all dummy frequency bandwidths from the output to provide a linearized output.

11. A linearization apparatus for processing a signal input comprising an amplitude modulated source signal having a source frequency bandwidth and exhibiting a source envelope, the apparatus comprising:

an envelope computer utilizing the source signal to compute a dummy envelope that would yield a predetermined constant if the source and dummy envelopes were to be combined;

a dummy signal generator providing an amplitude modulated dummy signal exhibiting the computed dummy envelope, where the dummy signal occurs at one or more predetermined dummy frequencies and the predetermined frequencies differ from the source frequency bandwidth;

an adder coupled to the signal input and the dummy signal generator to add the source signal and the dummy signal to form a combined signal available for processing by a module with amplitude dependent nonlinearity;

at least one filter to filter signals including signals of the dummy frequency bandwidth from output of the module to provide a linearized output.

12. The apparatus of claim 11, the apparatus further comprising:

the module;

where the module is coupled to the adder to receive the combined signal as input and provide an output exhibiting amplitude dependent nonlinearity.

13. The apparatus of claim 11, the envelope computer configured such that the computing operation comprises computing a dummy envelope that would yield a predetermined constant if the source and dummy envelopes were to be added.

14. The apparatus of claim 11, the envelope computer configured such that the computing operation comprises computing a dummy envelope that would yield a predetermined constant if the source and dummy envelopes were to be processed by predetermined formulas and the processed envelopes are added.

15. The apparatus of claim 14, the predetermined formulas comprising:

squaring the source signal envelope;

squaring the dummy signal envelope and then doubling the squared dummy signal envelope.

16. The apparatus of claim 11, where:

the envelope computer computes multiple dummy envelopes that would yield a predetermined constant if the source and all dummy envelopes were to be combined;

the dummy signal generator comprises multiple dummy signal generators to create multiple amplitude modulated dummy signals exhibiting corresponding ones of the multiple dummy envelopes each occurring at a dummy frequency bandwidth that differs from the source frequency bandwidth;

the adder is coupled to each dummy signal generator;

the filter removes signals including signals of the dummy frequency bandwidths from the output.

17. A linearization apparatus for processing an amplitude modulated source signal having a source frequency bandwidth and exhibiting a source signal envelope, the apparatus comprising:

envelope computing means for utilizing the source signal to compute a dummy envelope that would yield a predetermined constant if the source and dummy signal envelopes were combined;

dummy signal generating means for producing an amplitude modulated dummy signal exhibiting the computed dummy envelope, where the dummy signal occurs at a dummy frequency bandwidth that differs from the source frequency bandwidth;

adding means for adding the source signal and the dummy signal to form a combined signal available for processing by a module with amplitude dependent nonlinearity;

filtering means for removing signals including signals of the dummy frequency bandwidth from an output of the module to provide a linearized output.

* * * * *